United States Patent [19]

Christopherson

[11] 4,270,092

[45] May 26, 1981

[54] CURRENT CONTROLLING CIRCUITRY FOR LOGICAL CIRCUIT REFERENCE ELECTRIC LEVEL CIRCUITRY

[75] Inventor: Warren A. Christopherson, San Jose, Calif.

[73] Assignee: International Business Machines Corporation, Armonk, N.Y.

[21] Appl. No.: 40,270

[22] Filed: May 18, 1979

[51] Int. Cl.[3] .................... H03F 3/45

[52] U.S. Cl. .................... 330/257; 323/269; 323/316; 330/259; 330/260

[58] Field of Search .................... 330/257, 259, 260, 288, 330/290, 293, 310, 311; 323/4

[56] References Cited

U.S. PATENT DOCUMENTS

| | | | |
|---|---|---|---|
| 3,435,365 | 3/1969 | Greeson | 330/260 |
| 3,444,476 | 5/1969 | Leidich | 330/69 |
| 3,721,893 | 3/1973 | Davis | 323/4 |
| 3,868,583 | 2/1975 | Krabbe | 330/69 X |
| 4,024,462 | 5/1977 | Highnote et al. | 330/259 |
| 4,105,942 | 8/1978 | Henry | 330/297 X |

OTHER PUBLICATIONS

Chin, "On-Chip Voltage Regulator," *IBM Technical Disclosure Bulletin,* vol. 19, No. 6, Nov. 1976, pp. 2078, 2079.

Azzis, "Current-Source Scaling Circuit," *IBM Technical Disclosure Bulletin,* vol. 19, No. 5, Oct. 1976, pp. 1709, 1710.

Mitchell, "Pronolithic Current Source," *IBM Technical Disclosure Bulletin,* vol. 13, No. 12, May 1971, p. 3720.

Ogawa et al., "Stabilized Reference Voltage Source," *IBM Technical Disclosure Bulletin,* vol. 13, No. 9, Feb. 1971, p. 2689.

*Primary Examiner*—James B. Mullins
*Attorney, Agent, or Firm*—George E. Roush

[57] ABSTRACT

This current controlling circuitry is arranged to monitor and control the operation of transistor circuitry for the development of a highly accurate and stable reference electric level potential and/or current for distribution to a plurality of logical circuits on a semiconductor chip having of the order of a thousand such circuits thereon. A first order reference potential is developed by a current-source reference circuit and applied to a transistor operational amplifying circuit having current control circuitry connected in the biasing subcircuitry of that transistor amplifying circuit. This control circuitry essentially monitors the output of an amplifying circuit and adjusts feedback potential to an emitter bias supplying current source transistor for that amplifying circuit.

8 Claims, 5 Drawing Figures

Figure 1:
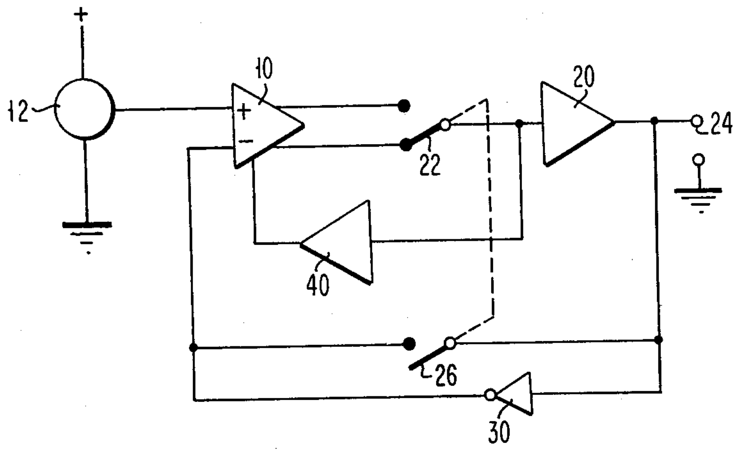

CURRENT CONTROLLING CIRCUITRY FOR LOGICAL CIRCUIT REFERENCE ELECTRIC LEVEL CIRCUITRY

The invention is related to a copending U.S. patent application Ser. No. 921,143, filed on the 30th day of June 1978, for "Logical Circuit Reference Electric Level Generating Circuitry" and thereafter issued on the 4th day of September 1979 as U.S. Pat. No. 4,166,982.

FIELD OF INVENTION

The invention relates to semiconductor potential or "voltage" and/or current regulating circuitry, and it particularly pertains to current controlling circuitry for integrated semiconductor devices of low electric potential requiring close supply "voltage" regulation.

BACKGROUND

Semiconductor current and potential regulating circuit arrangements are well known. As time passes, the need for lower power, faster, closer tolerance and lower cost circuitry arises. Others have offered particular solutions to particular problems in this problem area. One particular problem that has vexed the artisan is that brought about by relatively low collector electrode potential with which more recent semiconductor device families are operated, which potential is but a few times greater than the potential drop between the base and emitter electrodes of those semiconductor device families. Understandably the regulation desired is more difficult to achieve with these lower potential ratios.

SUMMARY

The objects of the invention indirectly referred to hereinbefore, and those that will appear as the specification progresses, obtain in novel current controlling circuitry comprising current mirror circuits interconnected in novel fashion for monitoring the output, which is desired to be constant, of an amplifying transistor, and adjusting the bias on that transistor for more tightly controlling the electric level of that output.

Basically this current controlling circuitry is arranged for application to any amplifying or translating circuit arrangement having at least one transistor including a base electrode, a collector electrode and an emitter electrode, and a load element connected to the collector electrode.

The novel current controlling circuitry is an amplifier circuit comprising two current mirror circuits interconnected for monitoring the electric energy level at a load element and adjusting the bias current applied to an emitter electrode. Briefly the current controlling circuitry comprises an input circuit transistor having a base electrode connected to the collector electrode of an amplifying circuit transistor, a collector electrode connected to a point of energizing potential, and an emitter electrode. An input circuit resistor element is connected between the emitter electrode of the input transistor and an input circuit diode element which has an electrode remote from the input circuit resistor connected to a point of fixed reference potential, such as ground. An output circuit transistor has a base electrode connected to the junction between the input circuit resistor element and the diode element, with an emitter electrode connected to the point of fixed reference potential. A diode element is connected between the collector electrode of the output circuit transistor and the point of fixed reference potential. The collector electrode of the output circuit transistor is energized through an output circuit resistor element and an output circuit diode element connected in series to the point of energizing potential. The output electric level at the collector electrode of the output circuit transistor is applied to the amplifying or translating transistor to adjust the bias for maintaining the output electric level substantially constant. This is usually accomplished with a current source transistor having a collector electrode connected to the emitter electrode of the amplifying circuit transistor, and an emitter electrode connected to the point of fixed reference potential; the base electrode is then connected to the collector electrode of the output circuit transistor of the current controlling circuitry.

One application of the circuitry according to the invention is particularly noteworthy. The operation of the reference electric level generating circuitry shown and described in the aforementioned U.S. Pat. No. 4,166,982, is improved, by the incorporation of the current controlling circuitry of the invention. With the added circuitry the overall generating circuitry comprises a differential amplifying circuit to one input terminal of which a primary reference potential is applied. One of the balanced output terminals of this differential amplifying circuit is applied to the input terminal of a repeating circuit arranged for delivering the desired reference voltage at the output terminal thereof. Regulation to the first order is effected by an inverse feedback connection between the output and the other input of the differential amplifying circuit. A second order of regulation is provided by the current controlling circuitry according to the invention. The input circuit transistor is connected to the load element and the differential amplifying circuit, and the output circuit transistor is connected to the current source transistor that is already present in the differential amplifying circuit.

DRAWING

Figure 2:
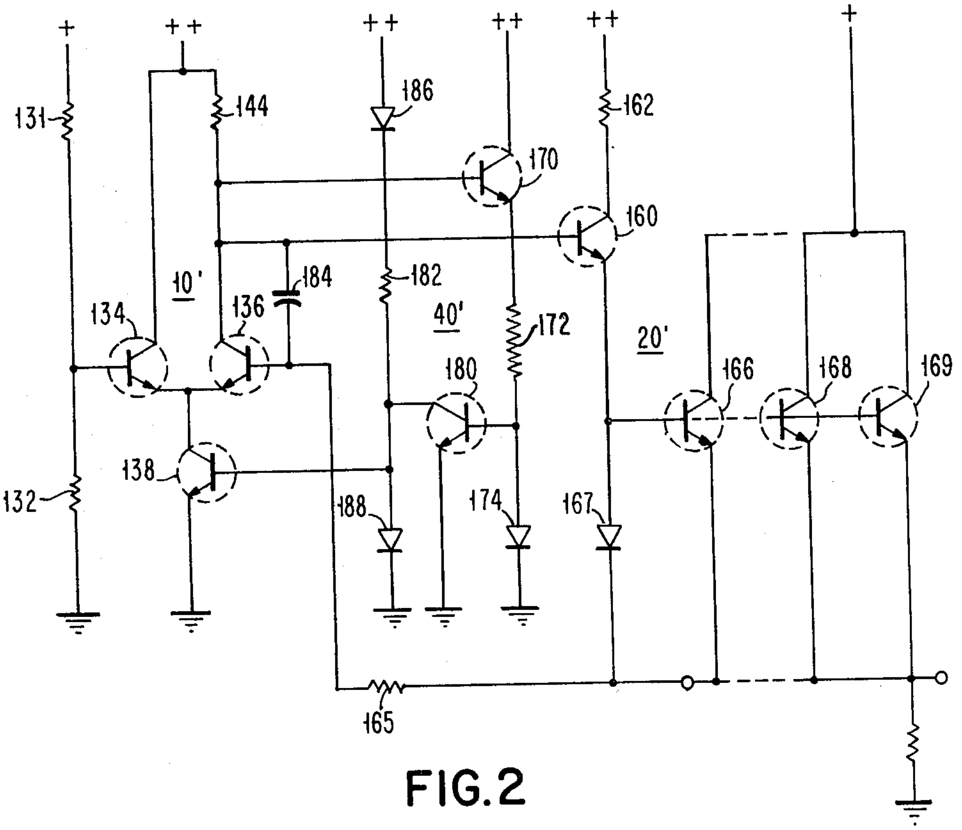
Figure 3A:
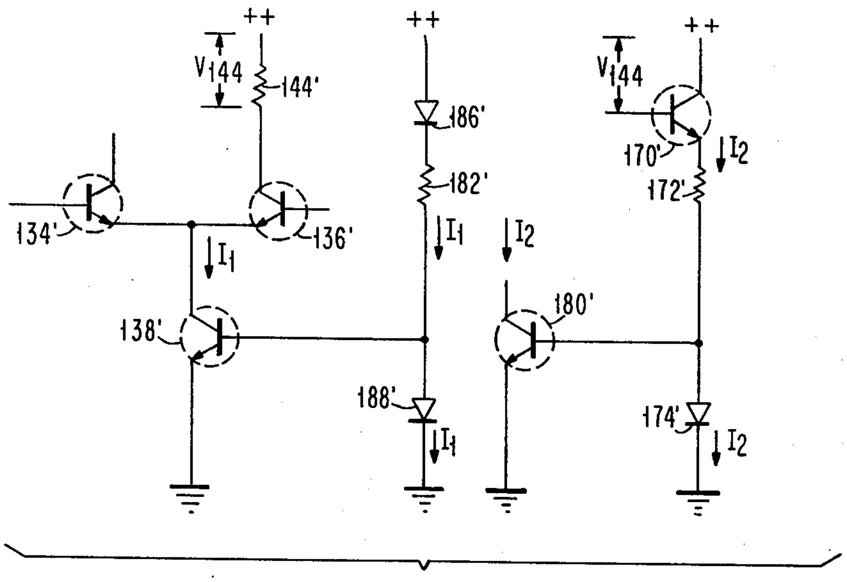
Figure 3B:
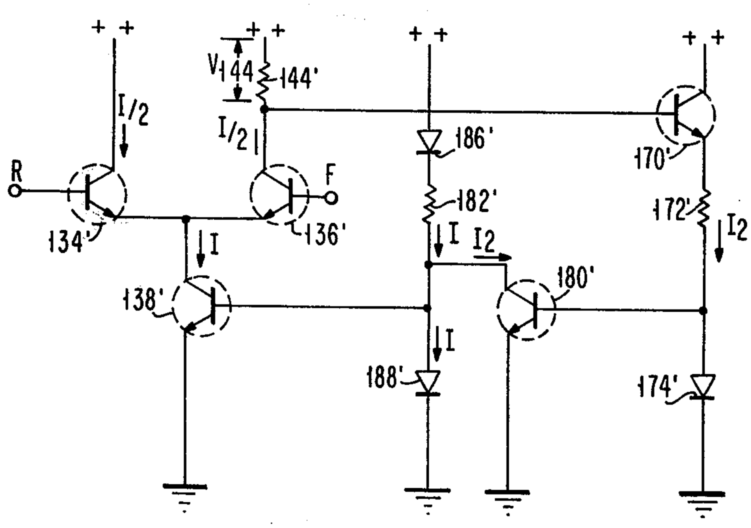
Figure 4:
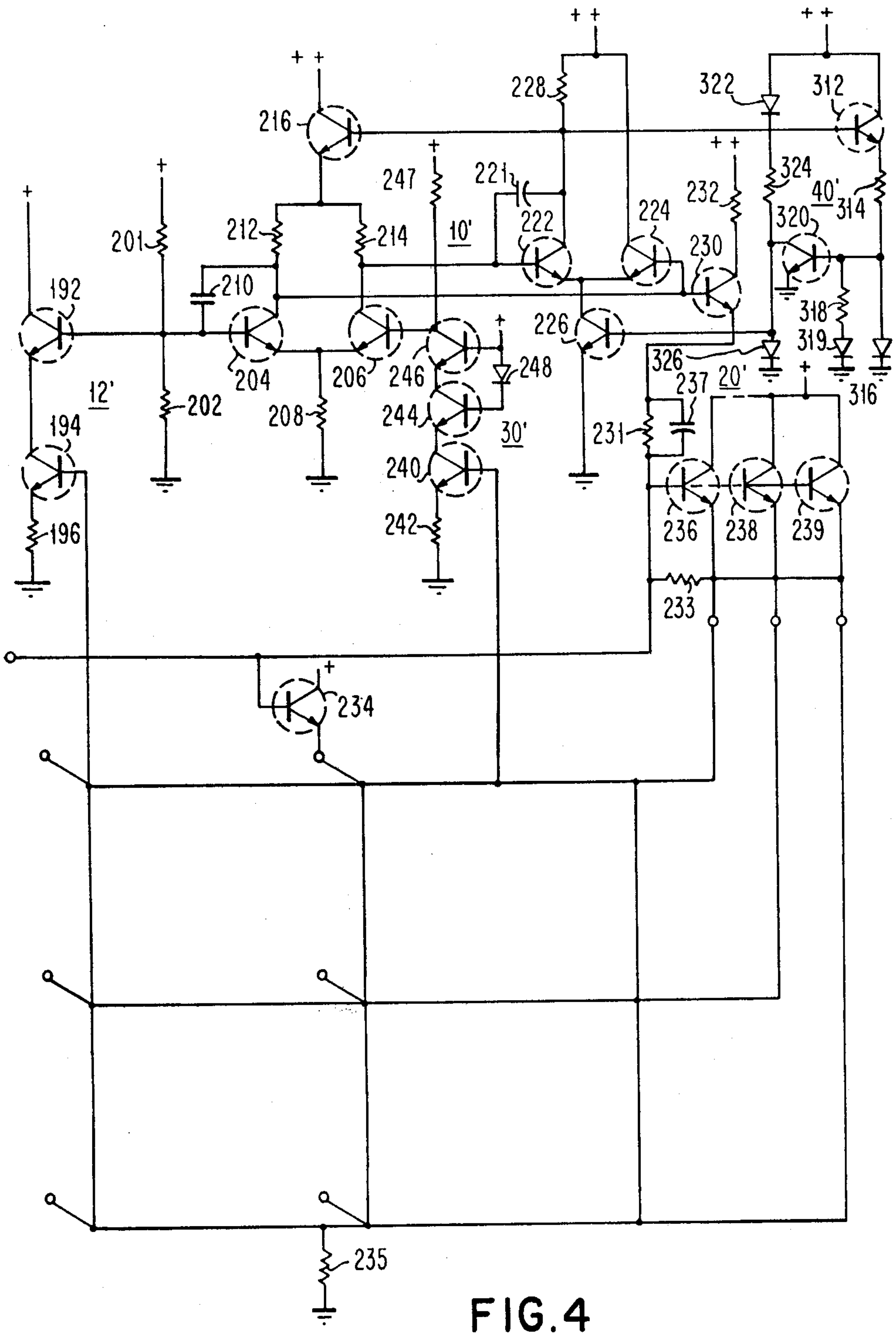

In order that all of the practical advantages of the invention obtain in practice, preferred and best mode embodiments thereof, given by way of example only, are described in detail hereinafter with reference to the accompanying drawing, forming a part of the specification, and in which:

FIG. 1 is a functional diagram of potential or "voltage" regulating circuitry according to the invention; and FIG. 2 is a schematic diagram of a basic application of current controlling circuitry according to the invention;

FIGS. 3*a* and 3*b* are equivalent schematic diagrams useful in an explanation of the basic current control circuitry according to the invention and the operation thereof; and FIG. 4 is a schematic diagram of an embodiment of voltage regulating circuitry incorporating current controlling circuitry according to the invention along with a simplified example of an equipotential grid layout.

DESCRIPTION

A functional diagram of circuitry for delivering a closely regulated potential incorporating current controlling circuitry according to the invention is shown in FIG. 1. A differential amplifying circuit 10 has one input terminal thereof connected to a source 12 of reference voltage connected between a point of positive potential and a point of fixed reference potential shown as ground. An unbalanced amplifying or repeating circuit 20 has the input terminal thereof connected, as shown by way of a switch 22 for example, to one of the output terminals of the first differential amplifying circuit 10 for delivering a regulated voltage at the output terminals 24, which voltage is applied in the normal or erect relationship through a switch 26, when closed, to the other input terminal of the differential amplifying circuit 10. In some embodiments of the circuit arrangements incorporating the invention, the output potential of the repeating circuit 20 is applied to the input circuit of the amplifying circuit 10 through an inverting circuit 30, with the switch 26 open, of course. Also the switch 22, must be shifted for connection to the other output terminal of the amplifying circuit 10 for consistency regarding polarity. Current controlling circuitry 40 according to the invention is connected between the output terminal of the differential amplifying circuit 10 as selected by the switch 22 and an input terminal of the differential amplifying circuit 10 leading to a bias current source for and within the differential amplifying circuit 10. These circuit arrangements will be shown hereinafter to apply to the more detailed schematic diagrams of different embodiments of the circuitry according to the invention, such as that shown in FIG. 2. In practice, these circuits are frequently laid down on a single semiconductor chip for regulating the voltage applied to the other, on the order of 1,000, load circuits on that chip. A typical load circuit of the type requiring the degree of regulation afforded by the regulating circuitry as modified with the current controlling circuitry according to the invention is shown in the hereinbefore mentioned U.S. Pat. No. 4,166,982, which depicts a transistor driver circuit.

BASIC EMBODIMENT

An embodiment of potential regulating circuitry incorporating current controlling circuitry 40' according to the invention is shown in FIG. 2. The reference voltage source 12 in this instance is comprised of two resistors 131, 132, connected in series between a point of positive energizing potential and the point of fixed reference potential shown here as ground. The reference potential at the junction of the two resistors 131, 132 is applied to the base electrode of a transistor 134 of the first amplifying circuit 10' having a complementary input transistor 136. Emitter electrodes of the latter transistors are connected to ground reference potential by way of a transistor 138.

Output from the amplifying circuit 10 is obtained across a load resistor 144 to which higher positive energizing potential is applied. The collector electrode of the transistor 134 is connected directly to the second source of positive energizing potential, while the collector electrode of the other transistor 136 is connected to the same energizing potential through a load resistor 144. The collector electrode of the transistor 136 is connected to the base electrode of a transistor 160 of the amplifying circuit 20'. Positive energizing potential is applied through a resistor 162 to the collector electrode of the amplifying transistor 160. The output of the latter transistor is applied to the base electrodes of a number of regulated potential or voltage output transistors, of which only transistors 166, 168 and 169 are shown. The latter transistors are effectively connected in emitter follower circuit configuration having like electrodes substantially connected in common, with individual load elements connected to the commonly connected emitter electrodes. The output transistors 166, 168 and 169 are thus incorporated in a negative feedback path of the amplifying circuit 10' from the collector to base of the transistor 136; the feedback loop includes the transistor 160. A diode 167 provides turn off bias for the transistors 166, 168 and 169. It is contemplated that up to the order of a thousand logical circuit loads will be accommodated, in which case there will be a number of these output emitter follower circuit output transistors dispersed about the semiconductor chip quite close to the point at which the regulated potential level is required.

The current controlling circuitry according to the invention comprises a pair of interconnected current mirror circuits coupled between the collector electrode of the amplifying circuit transistor 136 and the base electrode of the current source transistor 138. The current controlling circuitry comprises an input circuit transistor 170 having a base electrode connected to the collector electrode of the amplifying transistor 136, a collector electrode connected to the record source of positive energizing potential, and an emitter electrode connected to a resistor 172 which in turn is connected by way of a diode 174 to the point of fixed reference potential. An output circuit transistor 180 has a base electrode connected to the junction between the resistor 172 and the diode 174, and emitter electrode connected to the point of fixed reference potential and a collector electrode connected to a load resistor 182. This load resistor is connected to the second source of positive energizing potential by way of a diode 186. The collector electrode of the output circuit transistor 180 is connected to the base electrode of the current source transistor 138 with a diode 188 connected from that base connection to the point of fixed reference potential.

OPERATION

While a differential amplifying circuit has been shown and described, it should be noted here that the current controlling circuitry according to the invention is readily applied to a signal translating circuit comprising a single transistor as will be evident in connection with the operation of the circuitry depicted by the simplified diagrams of FIGS. 3*a* and 3*b*, wherein various components have been given, the same reference numerals primed, whereby the relationship of those corresponding portions of the circuitry shown in FIG. 2 more readily will be understood. It is an advantage in designing that all of the transistors have substantially the same base-emitter potential gradients, and that all of the diodes as shown are fashioned by interconnecting the base and collector electrodes of transistors of substantially the same construction whereby the anode-cathode potential gradients are substantially equal to the $V_{BE}$. Also all of the transistors have a beta ratio that is very high whereby the base current is therefore negligible and the emitter and collector currents are substantially equal. Those skilled-in-the-art will readily adapt the teachings to situations where adjustments must be made to the diode and transistor characteristics differing considerably from device to device, but more often will confine the choice of devices to advantages of simplicity and reliability afforded by closely similar structures as is the usual case in the design of integrated circuit devices.

Now referring specifically to FIG. 3*a*, which shows two current mirror circuits separately. The current $I_1$ flows in the transistor 138', which mirrors the current flowing in the diode 188'; thus the same value of current, $I_1$ flows through the diode 188', the resistor 182' and the diode 186'. Likewise, the current $I_2$ flows in the transistor 180' which mirrors the current flowing in the diode 174' so that at the same value of current, $I_2$, flows in the transistor 170', the resistor 172', and the diode 174'. The resistors 172' and 182' are made equal in value to each other and preferably are equal in value to half the value of the load resistor element 144' connected to the transistor 136'. The currents flowing in the two current mirror circuits in and of themselves are expressed (omitting the primes) by applying Ohm's law:

$$I_1=(V_{++}-2V_{BE})/R_{182} \quad (1)$$

and $$I_2=(V_{++}-V_{144}-2V_{BE})/R_{172} \quad (2)$$

Referring now to FIG. 3*b* showing a simplified schematic diagram of the current mirror circuits interconnected according to the invention in the transistor circuit whereby:

$$I=I_1-I_2 \quad (3)$$

Substituting: $\frac{1}{2}R_{144}=R_{172}=R_{182}$ $$I = (V_{++} - 2V_{BE})/R_{182} - (V_{++} - V_{144} - 2V_{BE})/R_{172} \quad (4)$$
$$= 2V_{144}/R_{144} \quad (5)$$

But $V_{144}/R_{144}=I_{R144}$ and thus $$I=2I_{R144}$$

and $$I_{134}=I-I_{R144}=I_{R144}=I_{136} \quad (6)$$

which insures the operation of the current controlling circuitry. Because the two collector currents in transistor elements 134 and 136 are equal, the base voltages of the transistors 134 and 136 are equal to a high degree of accuracy.

The power consumed is:

$$P=V_{++}(I_{138}+I_{R182}+I_{R172}) \quad (7)$$

But $$I_{138}=I_{R172}-I_{R182} \quad (8)$$

Therefore $$P=V_{++}2I_{172} \quad (9)$$

and since $$I_{R182}=(V_{++}-2V_{BE})/R_{182} \quad (10)$$

$$P=2V_{++}(V_{++}-2V_{BE})/R_{182} \quad (11)$$

In one example of circuit tested $V_{++}$ = 5V volts,
$R_{182} = R_{172}$ = 2.0 Kilohms, and
$V_{BE}$ = 0.75 volt, from which the nominal power
$P = 2 \times 5(5 - 2 \times 0.75)/2$ -continued = 17.5 miliwatts.

EXEMPLARY EMBODIMENT

An embodiment of the current controlling circuitry according to the invention incorporated in potential regulating circuitry is shown in FIG. 4. Here a first reference potential generating circuit 12 comprises a pair of resistors 201 and 202 connected in series between a point of positive energizing potential and a point of fixed reference potential shown here as ground. The base electrode of a transistor 192 is connected to the junction of the resistors 201 and 202 so that the base current slightly modifies the reference potential better to track other regulator potentials with respect to variations in temperature and process variables. The reference voltage at the junction point is applied connected to the base electrode of one input transistor 204 of a first and input stage of a differential amplifying circuit 10' having another complementary input transistor 206. The emitter electrodes of the two transistors are connected to ground through a resistor 208. A capacitor 210 is connected between the base electrode and the collector electrode of the first transistor 204. Load resistors 212 and 214 are individually connected to the collector electrodes of the transistors 204 and 206 and in common to the emitter-collector circuit of a transistor 216 to the second point of positive potential. A pair of transistors 222 and 224 forming the input transistor to a second stage of the differential amplifying circuit 10' have the base electrodes individually connected to the respective collector electrodes of the transistors 206 and 204. The emitter electrodes of the transistors 222 and 224 are connected in common through the collector-to-emitter circuit of a transistor 226 to the point of fixed reference potential shown as ground. The collector electrode of the transistor 222 is connected to the base electrode of the transistor 216 and to a load resistor 228 which is connected to the second point of positive potential. The collector electrode of the transistor 224 is connected directly to the second point of positive potential. A transistor 230 has a base electrode connected to the collector electrode of the transistor 204 of the amplifying circuit 10' and the collector electrode is connected through a limiting resistor 232 to the second point of positive energizing potential. The emitter electrode is connected in common through parallel connected resistor 231 and capacitor 237 to the base electrodes of a number of regulated voltage output transistors, of which only transistors 234, 236, 238 and 239 are shown in this figure. The collector electrodes of the latter transistors are all connected to the first point of positive energizing potential, and a common load resistor 235 is connected between the emitter electrodes and the point of fixed reference potential. The bias current for the transistors 234, 236, 238 and 239 among others is provided by a resistor 233 connected between the commonly connected base electrodes and the emitter electrodes. The emitter electrode of the reference voltage output transistor 234 particularly, although it is connected in common to the emitter electrodes of 8 other output transistors, is connected to the base electrode of the transistor 240 forming the input transistor of an inverting circuit 30'. The emitter electrode of the transistor 240 is connected to ground through a resistor 242. The inverter circuit 30' comprises two other transistors 244, 246, and a diode 248, the latter of which is connected between the base electrodes of the transistors 244 and 246. The anode electrode of the diode 248 is connected to the point of positive energizing potential, while the collector electrode of the transistor 246 is connected to the load resistor 247, to the point of positive potential and to the base electrode of the transistor 206 in the amplifying circuit 10'. The emitter electrode of the transistor 244 is connected directly to the collector electrode of the input transistor 240 completing the circuit of the inverting circuit.

Current controlling circuitry 40' according to the invention as shown in FIG. 4, comprises an input transistor 312 having a base electrode connected to the collector electrode of the amplifying circuit transistor 222. The collector-emitter circuit of the transistor 312 is connected in series with a resistor 314 and a diode 316 between the second point of positive potential and the point of fixed reference potential. Preferably a resistor 318 and a diode 319 are connected in series across the diode 316 for trimming the circuitry as will be discussed hereinafter. The junction of the resistor 314 and the diode 316 is connected to the base electrode of a transistor 320. The emitter electrode of the latter transistor is connected to the point of fixed reference potential while the collector electrode is connected to the base electrode of the transistor 226 and to the junction of a series circuit comprising a diode 322, a resistor 324 and another diode 326, with the latter of which shunting the collector-emitter circuit of the transistor 320 and the base-emitter circuit of the transistor 226 to the point of fixed reference potential.

The schematic diagrams have been drawn in conventional fashion affording convenience in understanding the operation of the circuitry. For example, source voltage, $V_{RS}$, voltage output transistor 234 is shown as located near the output distribution grid and, while other output transistors 236, 238 and 239 are shown adjacent to the transistor 230 which drives them. It should be noted that for each category of voltage output transistors, all of the base electrodes are connected in common, all of the collector electrodes are connected in common and all of the emitter electrodes are connected in common. This is true no matter where the regulated voltage output transistor is located on the semiconductor chip. Thus a lot of intended equi-potential conductors are laid down on the chip in this arrangement. However, there is actually a voltage drop in each of the conductors conveying the regulated output voltage. Because the common emitter follower transistors are in the feedback loop, changes in the common $V_{BE}$ drop due to temperature and load changes cause relatively little change in the common output voltage. In some applications of the regulating voltage circuitry according to the invention, the difference between the upper and lower limits of logical voltage levels is of the order of two thirds of the base-to-emitter voltage of the associated transistors. In such an arrangement voltage drops along the conductors may not always be considered negligible. Therefore the semiconductor chip, preferably, is gridded as suggested in FIG. 4 between the emitter electrodes of the regulator voltage output transistors 234, 236, 238 and 239. The regulated potential output transistors have the base electrodes connected by conventional circuit wiring as the base currents are low and only negligible voltage drops are encountered. The emitter electrodes are actually connected together in a gridded arrangement as suggested in FIG. 4 with the individual loads connected to the individual emitter electrodes of the nearest output transistor over very short leads of the grid conductors because the current is relatively large at these locations. The connections of the output transistors are usually connected to the grid conductors at evenly spaced intersections thereof, while the load circuits are connected at any point along a conductor at the nearest point. With this construction the logical voltage and/or current level to the logic circuitry is substantially uniform throughout the semiconductor chip.

Referring again to FIG. 1 with the switch 22 connected to the inverted output terminal of the amplifying circuit 10, and the switch 26 open, as shown, the basis for operation of the embodiment for modifying the current-source reference voltage generator as shown in FIG. 4 will be noted. An input reference voltage obtained from the circuit 12 is applied to the erect (+) input terminal of the differential amplifier 10. The inverted (−) input terminal of the differential amplifier circuit 10 is supplied with the output from the inverting circuit 30 to the input of which the current-source reference voltage is applied. The inverting circuit 30 represents a simulated or dummy logical circuit having a voltage gain of −0.5. The inverted output terminal of the differential amplifying circuit 10 is applied to the two stage emitter follower circuit 20, powerful enough to drive the current-source-reference-level voltage for the entire logical circuitry on the chip which contains about 1,000 circuits and/or current sources. The feedback action clamps the inverted output of the differential amplifying circuit 10 at a level determined by the components in the emitter follower 20 and in the inverting circuit 30.

Since the voltage at the inverted input terminal of the input amplifying circuit 10 is proportionally that of the output of the inverting logical circuit 30, the reference level voltage is automatically adjusted to a first degree for maintaining the logical circuit output voltage constant and equal to that of the reference voltage from the generating circuit 12. The clamping of the input to the emitter follower circuit 20 stems from the feedback by way of the inverting circuit 30 around the input amplifying circuit 10. The reference level is automatically adjusted to a second and higher degree of accuracy by the current controlling circuitry 40.

Referring specifically to FIG. 4, the voltage divider comprising resistors 201 and 202 delivers a voltage for application to the base electrode of the transistor 204 which is 0.265 volts below the energizing potential level (indicated by a single + symbol) which preferably is 3.0 volts. The desired logical circuit signal swing is 0.530 volts (twice 0.265 volts). The transistors 192 and 194 simulate one logical circuit load. The purpose of this load is to effect a wider voltage swing in the logical circuits on low beta semiconductor chips where it can be tolerated and thereby improve the "worst case" operation. The output impedance of the generating circuit 12 is 1,000 ohms which is the same as the simulated logic circuit comprising the inverter circuit 30'. Thus the loading of the reference generating circuit 12' by the input stage circuitry of the amplifying circuit 10' at the base electrode of the transistor 204 is compensated by the loading of the resistor 247 by the base electrode of the transistor 206. The latter transistors have generously sized emitters to achieve good $V_{BE}$ tracking within ±5 millivolts. The resistor 208 keeps the total emitter current at about 1 milliampere and the capacitors 210 and 237 prevent oscillation in the feedback loop through the amplifiers 20′ and 30′ by insuring that the feedback open loop gain magnitude is below unity at frequencies where the phase shift is 180 degrees or greater.

The amplifier 20′ is a two-stage emitter follower circuit comprising the transistor 230 and the output transistors of which 234, 236, 238, . . . 239 only as shown in this figure for powering and distributing the regulated source voltage output to the 1,000 or so logical circuits on the semiconductor chip. The voltage divider comprising the resistors 231 and 233 causes an additional $V_{BE}$ drop between the emitter of the transistor 230 and the base of the parallel connected transistors 236, 238 and so on. This is needed to keep the base electrode of the transistor 230 high enough so that the transistor 204 of the amplifying circuit 10′ does not saturate. The resistance of the resistor 231 is also needed to prevent latching of the inverted output of the amplifying circuit 10′ to the positive energizing potential through the base-emitter junction of the transistor 230 and the base collector junctions of the parallel transistors 236 and the like. Resistors in the collector leads of the emitter followers 234, 236, 238 and 239 can be interposed to limit the emitter currents in these output transistors to a safe level during powering up when the capacitance in the load supplied by the regulated source voltage is charging. As stated previously, the emitter follower transistors 234, 236, 238 and 239 are located on the grid about the semiconductor chip. Thus only the relatively small base current must be distributed whereby only a low distribution voltage drop results from small conductors.

In the inverting circuit 30′, the transistors 244 and 246 inject base current into the current source transistor 240 which compensates for the base currents injected by each of the logic levels in each of the working logic circuits on the semiconductor chip. The resistor 242 has the same nominal value as the logic current source resistor but requires closer tolerance in selecting the value. The resistor 247 has a value of half the logic load resistance therefore the voltage across the resistor 247 matches the output of the reference circuit 12 when conducting current equal to that in the typical logic load resistor. The voltage gain of the inverting circuit 30′ is approximately the ratio of the resistor 247 to the resistor 242 or 0.5.

The previously mentioned U.S. Pat. No. 4,166,982 provides further details of this operation, particularly with respect to an "evener" circuit of considerable importance. The current controlling circuitry according to the invention is actually interposed in this "evener" circuitry as shown for even better regulation of the output electric levels as has been described hereinbefore with respect to the basic embodiment.

Other embodiments of regulating potential generating circuitry as described in the U.S. Pat. No. 4,166,982 are equally enhanced by application of the current controlling circuitry according to the invention.

Referring again to FIG. 1, the switch 22 is now closed, thereby bypassing the inverter circuit 30. Switch 26 also now connects the erect output of the amplifying circuit 10 to the input of the amplifying circuit 20. With the exceptions to be noted, the circuit is very much the same and operates very much the same as previously described in detail. The reference circuit 12 provides a reference voltage at an impedance of approximately 1,000 ohms for application to the erect input transistor of differential amplifying circuit 10. Since the two input voltages to the differential amplifying circuit approximately match, dependent on transistor and current matching within the amplifying circuit, the inverted input of the amplifier 10 tracks the reference voltage at the erect input. The current flow in the amplifying circuit 10 is controlled in this case as in the other case whereby this negative feedback action clamps the output regulated voltage to an even tighter tolerance.

By taking advantage of the reference loading effect, the differential amplifying circuit 10 need not be restricted to low current operation. This simplifies the design of the circuitry and permits the use of a differential amplifying circuit with but two transistors as indicated in FIG. 2. This permits the best possible offset voltage between the two amplifier inputs.

Referring again to FIG. 4, the second stage of the amplifying circuit 10 is also a differentially connected common-emitter pair. The transistors, 222 and 224, have large emitters and are identical in design. This pair of transistors is a part of the evener circuit described in U.S. Pat. No. 4,166,982. Its accuracy can be improved by equalizing the emitter currents in the transistors 222 and 224. The biasing for this transistor pair has a total current-source current of about 0.5 milliampere. Without the circuitry according to the invention this current divides in a ratio varying from 1:3 to 3:1 depending on the value of the energizing potential indicated by the double positive (++) symbol. This voltage is on the order of 50±0.5 volts. The circuitry according to the invention makes the divided currents nearly equal and independent of any variation in the energizing potential denoted by the ++ symbol.

In the design shown, (FIG. 4), the potential across the resistor 228 is about 1.5 to 2.5 volts, large enough to reduce the differences in the $V_{BE}$ that do appear among the transistors to second-order effects. These $V_{BE}$ differences are minimized by designing the transistors with generous sized emitters which also minimizes the effect of dimensional tolerances. The current in the resistor 228 is high enough to make the loading from the transistor 312 but a small effect. Close resistor value matching is important. Some adjustment of the circuit is desirable even with the current control circuitry according to the invention as described. The resistor 318 and the diode 319 comprise trimming circuitry for accomplishing the adjustment. A beta range of 45 to 125 and a nominal beta of 75 to 80 is expected from normal production run LSI components. The consequent base currents cause a small but measurable upsetting of the perfect current balance predicted with the simplified analysis given hereinbefore. It has been found that an increase of about 40 microamperes, in a total of about 1300 microamperes, is needed in the current source transistor 226 to equalize the current to transistors 222 and 224 under nominal conditions. With the trimming resistor 318 equal to 2 kilohms, the current flowing in the two transistors is within 5 microamperes at nominal design.

The current controlled by the current controlling circuitry according to the invention may be any ratio to the monitored current. The output current ratio is accurately set by means of the ratio of the resistance values of the load element resistor 228 with series resistors 314 or 324 with the current mirror circuits. Thus there is provided a general means of generating an npn emitter current in any portion to another npn collector current, or proportional to any potential difference with respect to the collector return potential. This is accomplished quite accurately as the accuracy depends on resistor value ratios only.

While the invention has been described in terms of a preferred embodiment, and changes and variations have been suggested, it should be clearly understood that those skilled in the art will make further changes in their applications without departing from the spirit and scope of the inventions as defined in the appended claims concluding the specification.

The invention claimed is:

1. Current controlling circuitry for logical circuit reference electric energy level generating circuitry comprising a differential amplifying circuit having an internal adjustable bias source, having one input terminal to which a primary reference potential is applied, having another input terminal, having an amplifying circuit bias source controlling terminal, and having an output terminal, repeating circuitry having an input terminal connected to said output terminal of said differential amplifying circuit and having an output terminal at which said electric energy level is delivered, a feedback lead connected between said output terminal of said repeating circuitry and said other input terminal of said differential amplifying circuit, and current flow controlling circuitry including a current mirror amplifier circuit having an input terminal connected to said output terminal of said differential amplifying circuit and having an output terminal connected to said bias source controlling terminal of said differential amplifying circuit.

2. Logical circuit reference electric energy level current controlling as defined in claim 1, and incorporating an inverting amplifier circuit interposed in said feedback lead.

3. Current controlled logical circuit reference electric energy level generating circuitry as defined in claim 1, and wherein said differential amplifying circuit arrangement comprises at least one transistor including a base electrode, a collector electrode and an emitter electrode and a load element connected to said collector electrode, and said current controlling circuitry comprises an input circuit transistor having a base electrode connected to said collector electrode of said one differential amplifying circuit transistor, a collector electrode connected to a point of energizing potential, and an emitter electrode, an input circuit resistor element having one terminal connected to said emitter electrode of said input circuit transistor and having another terminal, an input circuit diode element having one electrode connected to said other terminal of said input circuit resistor and another electrode connected to a point of fixed reference potential, an output circuit transistor having a base electrode connected to said other terminal of said input circuit resistor, having an emitter electrode connected to said point of fixed reference potential and having a collector electrode, a diode element having one electrode connected to said collector electrode of said output circuit transistor and another electrode connected to said point of fixed reference potential, an output circuit diode element having one electrode connected to said point of energizing potential and having another electrode, an output circuit resistor element having one terminal connected to said other electrode of said output circuit diode element and having another terminal connected to said collector electrode of said output circuit transistor, and a source transistor having a collector electrode connected to said emitter electrode of said one amplifying circuit transistor, having an emitter electrode connected to said point of fixed reference potential, and having a base electrode connected to said collector electrode of said output circuit transistor.

4. Logical circuit reference electric potential current controlling circuitry comprising a differential amplifying circuit having at least two transistors, each having emitter, base and collector electrodes, circuitry establishing a primary reference potential coupled to the base electrode of one of said transistors, a bias source transistor having a collector electrode connected to both of said emitter electrodes of said amplifying transistors, having an emitter electrode connected to a point of fixed reference potential and having a base electrode, circuitry including one load resistor connecting the collector electrodes of said two transistors to a point of fixed energizing potential, current mirror circuitry connected between said point of energizing potential and said point of fixed reference potential, and having an input terminal connected to said one load resistor and an output terminal connected to said base electrode of said bias source transistor, an electric level translating circuit connected to the collector of one of the two transistors of the differential amplifying circuit, and having one coupling transistor including emitter, base and collector electrodes and at least one output transistor having emitter, base and collector electrodes, a resistor connecting the collector electrode of said one coupling transistor to said point of fixed energizing potential, an electric feedback connection between the emitter electrode of said one output transistor and the base electrode of the other transistor of said differential amplifying circuit, and output terminals individually connected to said emitter electrode of said one output transistor and to said point of fixed reference potential between which load circuitry is connected.

5. Current controlling circuitry for an amplifying circuit arrangement having at least one transistor including a base electrode, a collector electrode and an emitter electrode and a load element connected to said collector electrode, said circuitry comprising an input circuit transistor having a base electrode connected to said collector electrode of said amplifying circuit transistor, a collector electrode connected to a point of energizing potential, and an emitter electrode, an input circuit resistor element having one terminal connected to said emitter electrode of said input circuit transistor and having another terminal, an input circuit diode element having one electrode connected to said other terminal of said input circuit resistor and another electrode connected to a point of fixed reference potential, an output circuit transistor having a base electrode connected to said other terminal of said input circuit resistor, having an emitter electrode connected to said point of fixed reference potential and having a collector electrode, a diode element having one-electrode connected to said collector electrode of said output circuit transistor and another electrode connected to said point of fixed reference potential, an output circuit diode element having one electrode connected to said point of energizing potential and having another electrode, an output circuit resistor element having one terminal connected to said other electrode of said output circuit diode element and having another terminal connected to said collector electrode of said output circuit transistor, and a source transistor having a collector electrode connected to said emitter electrode of said amplifying circuit transistor, having an emitter electrode connected to said point of fixed reference potential, and having a base electrode connected to said collector electrode of said output circuit transistor.

6. Current controlling circuitry as defined in claim 5, and wherein all of the transistors have substantially the same $V_{BE}$ characteristics, and all of the diode elements have anode-cathode characteristics that match the transistor $V_{BE}$ characteristics.

7. Current controlling circuitry as defined in claim 5, and wherein all of said diode elements are realized by transistors having the base and collector electrodes interconnected.

8. Current controlling circuitry as defined in claim 5, and incorporating trimming circuitry connected across said input circuit diode element and comprising another diode element substantially the same as said input circuit diode element, a resistance element connected in series with said other diode element.

* * * * *